(12) United States Patent
Brockmeier et al.

(10) Patent No.: US 11,787,686 B2
(45) Date of Patent: Oct. 17, 2023

(54) METHOD FOR PROCESSING A LAYER STRUCTURE AND MICROELECTROMECHANICAL COMPONENT

(71) Applicant: Infineon Technologies AG, Neubiberg (DE)

(72) Inventors: Andre Brockmeier, Villach (AT); Wolfgang Friza, Villach (AT); Daniel Maurer, Feld am See (AT)

(73) Assignee: Infineon Technologies AG, Neubiberg (DE)

( * ) Notice: Subject to any disclaimer, the term of this patent is extended or adjusted under 35 U.S.C. 154(b) by 252 days.

(21) Appl. No.: 17/395,038

(22) Filed: Aug. 5, 2021

(65) Prior Publication Data

US 2021/0363002 A1    Nov. 25, 2021

Related U.S. Application Data

(62) Division of application No. 16/878,161, filed on May 19, 2020, now Pat. No. 11,180,362, which is a (Continued)

(30) Foreign Application Priority Data

Sep. 4, 2017   (DE) .......................... 102017120290.0

(51) Int. Cl.
*B81B 7/00*         (2006.01)
*B81C 1/00*         (2006.01)

(52) U.S. Cl.
CPC .......... *B81B 7/0006* (2013.01); *B81B 7/0009* (2013.01); *B81C 1/00246* (2013.01); *B81C 1/00476* (2013.01); *B81C 1/00595* (2013.01)

(58) Field of Classification Search
CPC ............. H01L 51/0094; H01L 51/5259; H01L 23/295

See application file for complete search history.

(56) References Cited

U.S. PATENT DOCUMENTS 5,645,684 A   7/1997 Keller
6,563,106 B1  5/2003 Bowers et al.
(Continued)

FOREIGN PATENT DOCUMENTS

CN    102906010 A    1/2013
DE    19847455 A1    4/2000
(Continued)

*Primary Examiner* — Dale E Page
*Assistant Examiner* — Wilner Jean Baptiste
(74) *Attorney, Agent, or Firm* — Slater Matsil, LLP

(57) ABSTRACT

In accordance with various embodiments, a method for processing a layer structure is provided, where the layer structure includes a first layer, a sacrificial layer arranged above the first layer, and a second layer arranged above the sacrificial layer, where the second layer includes at least one opening, and the at least one opening extends from a first side of the second layer as far as the sacrificial layer. The method includes forming a liner layer covering at least one inner wall of the at least one opening; forming a cover layer above the liner layer, where the cover layer extends at least in sections into the at least one opening; and wet-chemically etching the cover layer, the liner layer and the sacrificial layer using an etching solution, where the etching solution has a greater etching rate for the liner layer than for the cover layer.

20 Claims, 9 Drawing Sheets

Related U.S. Application Data division of application No. 16/108,538, filed on Aug. 22, 2018, now Pat. No. 10,766,766.

(56) References Cited

U.S. PATENT DOCUMENTS

| | | |
|---|---|---|
| 6,949,812 B2 | 9/2005 | Losehand et al. |
| 9,554,213 B2 | 1/2017 | Miles et al. |
| 2003/0205552 A1 | 11/2003 | Hansford et al. |
| 2004/0121506 A1 | 6/2004 | Gogoi |
| 2005/0098840 A1 | 5/2005 | Fuertsch et al. |
| 2006/0131630 A1 | 6/2006 | Sun et al. |
| 2006/0133043 A1* | 6/2006 | Boudreaux ............ H05K 1/144 |
| | | 361/704 |
| 2009/0149024 A1 | 6/2009 | Huang et al. |
| 2012/0138436 A1 | 6/2012 | Gambino et al. |
| 2013/0005133 A1 | 1/2013 | Lee et al. |
| 2013/0299925 A1 | 11/2013 | Classen et al. |
| 2016/0090299 A1 | 3/2016 | Sasagawa et al. |
| 2019/0287907 A1* | 9/2019 | Mahler ................ H01L 21/565 |

FOREIGN PATENT DOCUMENTS

| | | |
|---|---|---|
| DE | 60315749 T2 | 6/2008 |
| DE | 102012208030 A1 | 11/2013 |
| EP | 1352877 B1 | 8/2007 |
| IT | MI20042128 A1 | 2/2005 |
| KR | 20070046087 A | 5/2007 |

* cited by examiner

METHOD FOR PROCESSING A LAYER STRUCTURE AND MICROELECTROMECHANICAL COMPONENT

This application is a divisional of U.S. patent application Ser. No. 16/878,161, filed May 19, 2020, which is a divisional of U.S. patent application Ser. No. 16/108,538, filed Aug. 22, 2018, which application claims the benefit of German Application No. 102017120290.0, filed on Sep. 4, 2017, which applications are hereby incorporated herein by reference in its entirety.

TECHNICAL FIELD

Various exemplary embodiments relate to a method for processing a layer structure and to a microelectromechanical component.

BACKGROUND

In general, various micro-structured components can be produced using semiconductor technology or other technologies. By way of example, there are a multiplicity of application possibilities for micro-structured components, e.g. as sensors, actuators, filters, and the like. A microstructure (e.g. having a feature size in the micrometers range or smaller) can also be produced in conjunction with an electrical structure appropriately matching it. If mechanical properties of a microstructure are utilized, e.g. an oscillation, an expansion, or the like, a microstructure of this type can be referred to as a micromechanical structure. Together with an electrical structure for operating (e.g. for supplying, reading, etc.) the micromechanical structure, the latter can be referred to as a so called microelectromechanical system (MEMS) or as a microelectromechanical component. In this case, by means of conventional methods or method sequences, for example, it can be difficult to produce cavities for microstructures with sufficient quality and at the same time also in an economically expedient manner.

SUMMARY

In accordance with various embodiments, a microelectromechanical component can comprise the following: a first layer and a second layer arranged above the first layer, wherein a cavity is provided between the two layers, and wherein the second layer comprises a contacting region, a liner layer, which is arranged in the contacting region above the second layer, wherein the liner layer comprises an undoped oxidic material and wherein the liner layer has a layer thickness of less than 50 nm, a cover layer, which is arranged in the contacting region above the liner layer, wherein the cover layer comprises a doped oxidic material and wherein the cover layer has a greater layer thickness than the liner layer, wherein a contact hole extends through the liner layer and the cover layer as far as the second layer for the purpose of contacting a surface section of the second layer; an electrically conductive diffusion barrier layer, which completely covers the cover layer, a sidewall of the contact hole and the surface section of the second layer; and a metal layer arranged above the diffusion barrier layer for contacting the second layer in the contacting region.

In accordance with various embodiments, a method for processing a layer can comprise the following: forming a cutout in the layer; covering an inner wall of the cutout with a liner material; then filling a remaining region of the cutout with a further material; completely removing the liner material and the further material from the cutout by means of wet-chemically etching the liner layer using an etching solution, wherein the etching solution has a greater etching rate for the liner layer than for the cover layer.

BRIEF DESCRIPTION OF THE DRAWINGS

Exemplary embodiments are illustrated in the figures and are explained in greater detail below.

DETAILED DESCRIPTION OF ILLUSTRATIVE EMBODIMENTS

Figure 1A:
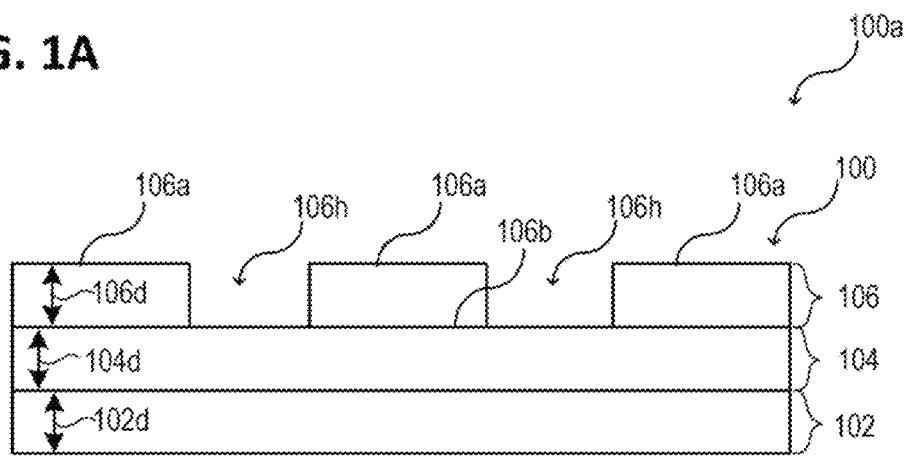
FIGS. 1A to 1F show in each case a schematic view of a layer structure during the processing of the layer structure, in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In accordance with various embodiments, a cavity can be produced in a layer structure by using a sacrificial layer as a placeholder between two layers of the layer structure, wherein the sacrificial layer is at least partly removed and thus leaves behind the cavity. For removing the sacrificial layer, it is possible for example for access holes to be provided in at least one of the layers, such that the sacrificial layer can be removed by means of an etching solution through the access holes. Illustratively, the sacrificial layer can be removed at least in sections through a perforated layer by means of wet chemical etching.

In accordance with various embodiments, a method is provided by means of which a sacrificial layer arranged between two layers can be removed efficiently and with sufficient quality. This is accomplished even if, for example, for process engineering reasons, a cover layer which can be removed wet chemically only at a low etching rate is arranged above the layer comprising the access holes. To that end, illustratively, an additional liner layer is arranged between the cover layer and the layer, wherein the liner layer comprises a material which can be removed at a high etching rate in order, for example, rapidly to produce an access through the access holes to the sacrificial layer, even if the cover layer has not yet been completely removed in sections. In this case, the liner layer and the cover layer can furthermore perform the function of a dielectric layer stack, e.g. in a contacting region for contacting at least one of the layers.

In accordance with various embodiments, by way of example, the inner wall of a cutout (e.g. of a through hole, of a trench, etc.) is lined with a liner layer composed of a material which can be removed (e.g. etched wet chemically) easily (e.g. at a high etching rate). Afterward, the cutout can be partly or completely filled with a further material, which can be removed (e.g. etched wet chemically) only with difficulty (e.g. at a low etching rate). During subsequent wet chemical etching, the cutout is etched free rapidly and cleanly along the liner layer into the depth even before the remaining material has been completely removed from the cutout. During wet chemical etching into the depth, for example, this makes possible a time advantage and furthermore a clean etching result.

In accordance with various embodiments, use is made of a so called etching promoter layer composed of a material which can easily be removed by means of wet chemical etching in order to ensure a rapid and clean wet-chemical etch along a path defined by the extent of the etching promoter layer.

In accordance with various embodiments, a layer structure can be processed, e.g. structured, by means of an etching promoter layer. By way of example, a cavity can be formed in a carrier by means of the etching promoter layer.

In accordance with various embodiments, a layer structure can comprise a first layer, a sacrificial layer arranged above the first layer, and a second layer arranged above the sacrificial layer, wherein the second layer comprises at least one opening, wherein the at least one opening extends from a first side of the second layer as far as the sacrificial layer, wherein a method for processing the layer structure can comprise the following: forming a liner layer, which covers at least one inner wall of the at least one opening; forming a cover layer above the liner layer, wherein the cover layer extends at least in sections into the at least one opening; and wet-chemically etching the cover layer, the liner layer and the sacrificial layer by means of an etching solution, wherein the etching solution has a greater etching rate for the liner layer than for the cover layer.

The etching rate, for example also referred to as rate of etching, represents the material removal of a structure (e.g. of a layer) per time. During the process of etching a structure, the etching rate thus also represents a change in an extent (e.g. length, width, depth and/or height) of the structure on account of the material removal per time. During the process of etching a layer from a side, the etching rate thus also represents a change in the layer thickness of the layer on account of the material removal per time.

In accordance with various embodiments, the liner layer and the cover layer are etched at different rates in a common etching solution on account of their different material properties or material configurations, i.e. in other words their etching rates differ from one another.

On the basis of processing the layer structure in the manner such as is described herein, the possibility is simultaneously afforded of producing an improved electrical contact on the second layer arranged above the sacrificial layer. In this case, the region in which the second layer is contacted (referred to herein as contacting region) is laterally alongside the region in which the at least one opening is formed and below which, for example, the sacrificial layer is removed. Illustratively, the layer structure can comprise a region in which a cavity is formed, and a contacting region, wherein the liner layer and the cover layer in the contacting region serve as a dielectric insulation.

A description is given below of various embodiments in which a dielectric layer stack is used as intermediate material or planarization material during the production of component structures, e.g. micromechanical or microelectromechanical structures. In this case, the layer stack is configured in such a way that the layer stack can be rapidly etched wet-chemically. To that end, the layer stack can comprise at least a first layer, e.g. a liner layer, and a second layer, e.g. a cover layer, wherein the materials of these two layers are chosen in such a way that the first layer promotes a wet-chemical etch in which the second layer is also involved. In accordance with various embodiments, the first layer can be a thin oxide liner (e.g. a TEOS (tetraethoxysilane) liner deposited by means of LP-CVD) and the second layer can be a so-called BPSG (borophosphosilicate glass) layer.

A BPSG layer can have flow properties on account of the doping, for example, such that it can be planarized by means of a thermal treatment. This can be advantageous for some applications; by way of example, it is thus possible to ensure a reliable contacting of a layer through the BPSG layer, as described herein.

Although some configurations are described herein on the basis of a BPSG layer and an oxide liner (e.g. a USG liner or an LP-CVD TEOS liner), which can be advantageous, other materials or material combinations can also be used in a similar manner. In this case, the materials can be selected in such a way that they have different etching rates vis à vis an etching solution used, wherein the first layer, e.g. the liner layer, has a higher etching rate than the second layer, e.g. the cover layer, vis-à-vis the etching solution used.

In accordance with various embodiments, a liner layer can be deposited conformally, that is to say that the liner layer for example also covers a structured support completely with a layer of substantially uniform thickness.

A description is given below of a method for processing a layer structure, in accordance with various embodiments, wherein said layer structure is illustrated in FIGS. 1A to 1F in a schematic side view or cross-sectional view at various points in time during processing.

FIG. 1A shows a layer structure 100 at the beginning 100a of processing or before processing, in accordance with various embodiments.

The layer structure 100 can comprise for example a first layer 102. The first layer 102 can be for example an arbitrary suitable layer, e.g. a metal layer, a polymer layer, a semiconductor layer, or the like. Furthermore, the first layer 102 can be for example an arbitrary suitable layer stack 102, e.g. comprising one or more metal layers, one or more polymer layers, one or more electrically insulating layers, one or more semiconductor layers, or the like. In accordance with various embodiments, the first layer 102 can be a monocrystalline or polycrystalline semiconductor layer, e.g. a monocrystalline or polycrystalline silicon layer. The first layer 102 can for example be self-supporting or be part of a carrier, e.g. of a silicon wafer. The first layer 102 can have for example a layer thickness 102d in a range of approximately 0.1 μm to approximately 1 mm, e.g. in a range of approximately 0.1 m to approximately 2 m, e.g. in a range of approximately 0.1 μm to approximately 0.5 μm.

In accordance with various embodiments, the first layer 102 can be a substrate or be formed on a substrate. In accordance with various embodiments, the first layer 102 can be a sensor layer of a sensor structure. In accordance with various embodiments, the first layer 102 can be a membrane layer of a microphone structure.

Furthermore, the layer structure 100 can comprise a sacrificial layer 104. The sacrificial layer 104 can be arranged above (e.g. directly on) the first layer 102. The sacrificial layer 104 can be deposited for example on the first layer 102. The sacrificial layer 104 can have for example a layer thickness 104d in a range of approximately 100 nm to approximately 10 μm.

Furthermore, the layer structure 100 can comprise a second layer 106. The second layer 106 can be for example an arbitrary suitable layer 106, e.g. a metal layer, a polymer layer, a semiconductor layer, or the like. Furthermore, the second layer 106 can be for example an arbitrary suitable layer stack 106, e.g. comprising one or more metal layers, one or more polymer layers, one or more electrically insulating layers, one or more semiconductor layers, or the like. In accordance with various embodiments, the second layer 106 can be a monocrystalline or polycrystalline semiconductor layer, e.g. a monocrystalline or polycrystalline silicon layer. The second layer 106 can be deposited on the sacrificial layer. The second layer 106 can have for example a layer thickness 106d in a range of approximately 500 nm to approximately 50 μm.

In accordance with various embodiments, the second layer 106 can be an electrode layer of a sensor structure. In accordance with various embodiments, the second layer 106 can be an electrode layer of a microphone structure.

In accordance with various embodiments, the sacrificial layer 104 can be configured in such a way that it can be removed in a simple manner between the two layers 102, 106. Illustratively, the sacrificial layer can comprise or consist of a material which can be removed by means of wet-chemical etching in a simple manner; by way of example, the sacrificial layer 104 can comprise or consist of an oxide, e.g. silicon oxide, e.g. LPCVD-TEOS.

In order to at least partly remove the sacrificial layer 104 between the two layers 102, 106, the second layer 106 can comprise at least one opening 106h (i.e. one or more openings 106h). The at least one opening 106h can extend for example from a first side 106a of the second layer 106 to a second side 106b of the second layer 106, said second side being situated opposite the first side 106a, e.g. as far as the sacrificial layer 104. Illustratively, the second layer 106 can be perforated or comprise a predefined number of through holes 106h, corresponding to the dimensions of the cavity which is intended to be formed between the two layers 102, 106 by means of removing the sacrificial layer 104.

In accordance with various embodiments, the two layers 102, 106, after at least partly removing the sacrificial layer 104, can form a micromechanical or microelectromechanical system (e.g. a sensor, e.g. a pressure sensor, e.g. a microphone, e.g. a loudspeaker, etc.) or be part of a micromechanical or microelectromechanical system (e.g. of a sensor, e.g. of a pressure sensor, e.g. of a microphone, e.g. of a loudspeaker, etc.).

The layer structure 100 can, in accordance with various embodiments, be processed as follows: in 100b, forming a liner layer 108, which covers at least one inner wall 106w of the at least one opening 106h (as is illustrated in a schematic side view or cross-sectional view for example in FIG. 1B); in 100c, forming a cover layer 110 above the liner layer 108, wherein the cover layer 110 extends at least in sections into the at least one opening 106h (as is illustrated in a schematic side view or cross-sectional view for example in FIG. 1C); and, in 110d-1 to 110d-3, wet-chemically etching the cover layer 110, the liner layer 108 and the sacrificial layer 104 by means of an etching solution, wherein the etching solution has a greater etching rate for the liner layer 108 than for the cover layer 110 (as is illustrated in each case in a schematic side view or cross-sectional view for example in FIG. 1D, FIG. 1E and FIG. 1F).

The liner layer 108 can, if necessary, cover only the inner wall 106w of the at least one opening 106h, which can be produced for example by means of a spacer etch. In accordance with various embodiments, the liner layer 108 can cover both the second layer 106 and in sections the sacrificial layer 104.

Figure 1B:
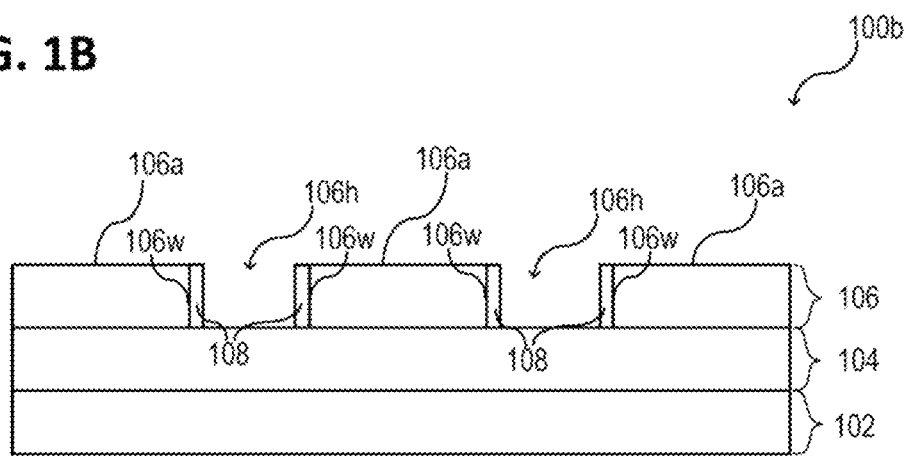
Figure 1C:
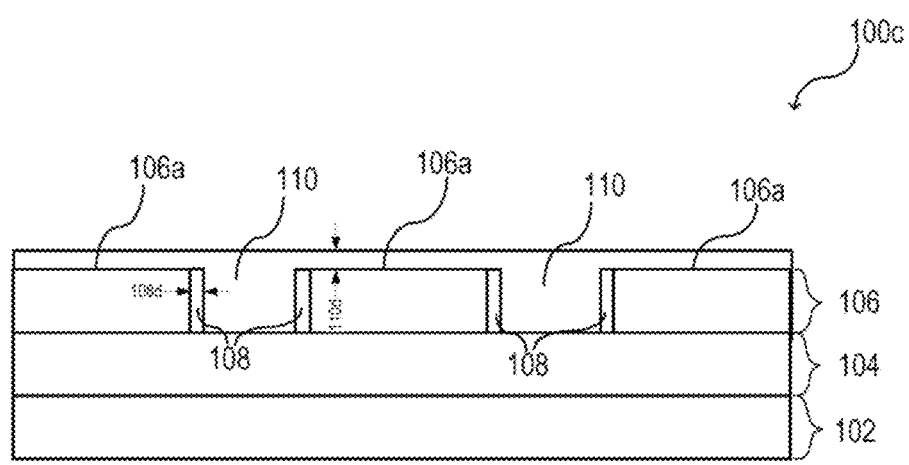

As is illustrated in FIG. 1B, for example, the liner layer 108 can cover at least the inner wall 106w of the at least one opening 106h. The liner layer 108 can extend from the first side 106a of the second layer 106 as far as the sacrificial layer 104. In this case, the liner layer 108 can be formed in direct physical contact with the sacrificial layer 104. The liner layer 108 can for example completely line the respective opening 106h. The respective opening or the inner wall 106w thereof can have an arbitrarily suitable shape.

Figure 2A:
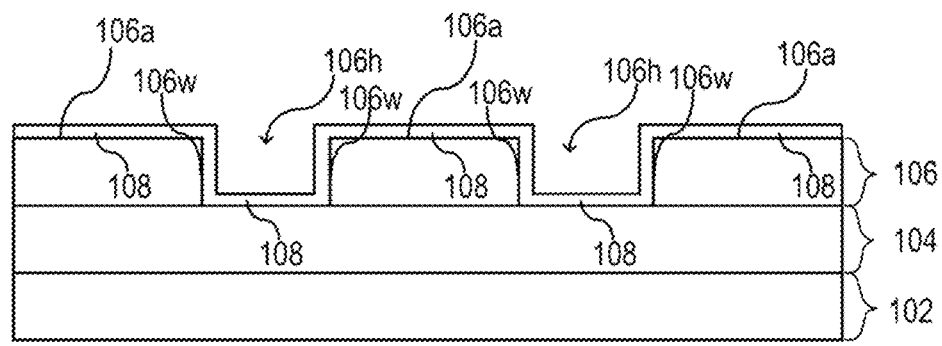
FIGS. 2A to 2C show in each case a schematic view of a layer structure during the processing of the layer structure, in accordance with various embodiments.

In accordance with various embodiments, the liner layer 108 can also partially or completely cover that surface of the sacrificial layer 104 which is exposed toward the opening 106h. Furthermore, the liner layer 108 can also partly or completely cover the first side 106a (i.e. the surface facing away from the sacrificial layer 104) of the second layer 106, as is illustrated in a schematic side view or cross-sectional view for example in FIG. 2A. In this case, the liner layer 108 can cover the exposed surface of the layer structure 100 as a conformal layer.

In accordance with various embodiments, the liner layer 108 can be formed by means of a chemical or physical vapor deposition, e.g. by means of PE-CVD, SA-CVD, LP-CVD, ALD, RTO, thermal evaporation, laser deposition, cathode sputtering (also referred to as sputtering or sputter deposition), etc.

In accordance with various embodiments, the cover layer 110 can be formed above (e.g. directly on) the liner layer 108. In accordance with various embodiments, the cover layer 110 can be formed by means of a chemical or physical vapor deposition, e.g. by means of PE-CVD, LP-CVD, SA-CVD, ALD, RTO, thermal evaporation, laser deposition, cathode sputtering, etc.

In accordance with various embodiments, the remaining space in the respective opening 106h can be filled by means of the cover layer 110. Furthermore, the cover layer 110 can also be formed above the first side 106a (i.e. the surface facing away from the sacrificial layer 104) of the second layer 106 and there, if appropriate, partly or completely cover the liner layer 108, as is illustrated in a schematic side view or cross-sectional view for example in FIG. 1C and also in FIG. 2B.

In accordance with various embodiments, the liner layer 108 can comprise an undoped oxidic material, e.g. undoped silicon oxide (also referred to as USG, "undoped silicate glass", "undoped silica glass" or "undoped silicon glass"). The cover layer 110 can, in accordance with various embodiments, comprise a doped oxidic material, e.g. doped silicon oxide. As dopant for the silicon oxide of the cover layer 110 it is possible to use, for example, phosphorus (also referred to as PSG, "phosphosilicate glass"), boron (also referred to as BSG, "borosilicate glass") or both (also referred to as BPSG, "borophosphosilicate glass").

In accordance with various embodiments, the cover layer 110 can comprise or consist of BPSG. The cover layer 110 can be subjected to thermal treatment after it has been deposited, such that it can flow, for example, and can thus be planarized. In accordance with various embodiments, the liner layer 108 can be configured as a diffusion barrier below the cover layer no in order that, for example, one dopant or a plurality of dopants cannot escape from the cover layer no into the underlying layers, e.g. into the second layer 106.

If silicon oxide-based materials, for example, are used for the liner layer 108 and the cover layer no, the etching solution can be a hydrofluoric acid-based etching solution. Other materials can be used in an analogous manner with an appropriate etching solution. Furthermore, the sacrificial layer 104 can comprise a silicon oxide-based material, e.g. an undoped silicon oxide, such that the latter can be removed by means of the hydrofluoric acid-based etching solution. Furthermore, the layers 102, 106 can comprise a material that is substantially not removed by means of the hydrofluoric acid-based etching solution, e.g. pure silicon.

The use of BPSG is known in semiconductor fabrication. The dielectric material can fulfill a multiplicity of functions, such as e.g. gettering mobile ions, protecting the substrate or planarizing the surface topography. PE-CVD or SA-CVD BPSG oxides can be relatively unstable in comparison with thermal undoped LP-CVD oxides, wherein a densification and stabilization of the BPSG layer can be carried out with the aid of an annealing process (also referred to as heat treatment or thermal treatment) at temperatures of more than 800° C. On account of the liner layer 108 described herein, undesired side effects, such as e.g. an outdiffusion of dopants, a formation of defects within the BPSG layer and/or a formation of boron- or phosphorus-induced doping profiles, can be prevented.

In order to minimize the interaction of the BPSG layer with the substrate and/or adjoining layers, it is possible for example for the boron and phosphorus content of the layers to be accurately defined. If the defined dopant limits are not complied with during the deposition of the BPSG material, the material can be the source of various defect formations which reduce the reliability and yield of a MEMS or some other, e.g. purely electrical, component.

By way of example, the process-dictated variation of the boron and/or phosphorus content can lead to an uncontrolled variation of the etching rates of the BPSG material. However, the increased tendency toward diffusion of introduced dopants can also contribute to an impurity doping of the layers or substrate lying below the BPSG if a diffusion barrier is not present. This can lead both to a shift and to an increased fluctuation of the electrical characteristic variables of the component (e.g. to an increased standard deviation of the pull-in voltage from wafer/wafer or batch/batch).

If a fixed time etch is taken as a basis when wet-chemically etching free perforated structures, for example an uncontrolled variation of the etching rates of the dielectric BPSG material, without a correspondingly configured liner layer 108 or a correspondingly performed method, as described herein, leads to incomplete etching free and to the formation of residues which can remain on the corresponding structures (e.g. between the two layers 102, 106) and can adversely influence the integrity and reliability of the entire component.

If residues remain below the perforated counterelectrode of a MEMS (e.g. below the second layer 106 having the openings 106h), they can contribute to a considerable minimization of the robustness of the MEMS, since they can function as so-called hot spots at which fracture of the membrane and also possible sticking of both structure elements (e.g. of the two layers 102, 106) are possible.

However, the formation of thin $SiO_x$ layers or discolorations are also further phenomena that lead to formation of defects and thus to loss of yield during the final optical inspection of the system wafers. The formation of said layers generally proceeds in an uncontrolled manner or is greatly dependent on the deposition conditions of the BPSG layer, e.g. supply and concentration of the dopants. Slight variations in the deposition can thus lead to undesired formation of defects.

In accordance with various embodiments, the abovementioned adverse influences of a doped cover layer 110 can be avoided or at least reduced by means of the correspondingly configured liner layer 108 and the method described.

The cover layer 110 could also be formed from an undoped oxidic material, although this can lead to undesired effects in the structure generation in the further process sequence (e.g. during the electrical contacting). In accordance with various embodiments, it can be advantageous to form the liner layer 108 from undoped oxidic material with a small layer thickness 108d, e.g. with a layer thickness of less than 50 nm, e.g. with a layer thickness of 5 nm to 50 nm, or with a layer thickness of 10 nm to 40 nm (see FIG. 4B, for example). In accordance with various embodiments, the layer thickness 108d of the liner layer 108 can be measured perpendicular to the respective surface of the support (e.g. the wall of the opening 106h or the top side 106a of the second layer 106) on which the liner layer 108 is arranged.

In accordance with various embodiments, the cover layer 110 can have a greater layer thickness 11od than the liner layer 108. The layer thickness 11od of the cover layer 110 can be measured for example perpendicular to the support (e.g. perpendicular to the surface of the underlying liner layer 108).

Figure 1D:
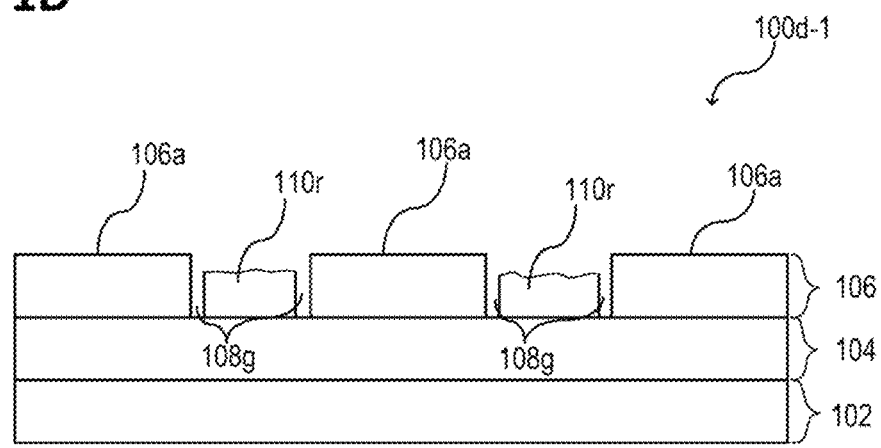
Figure 1E:
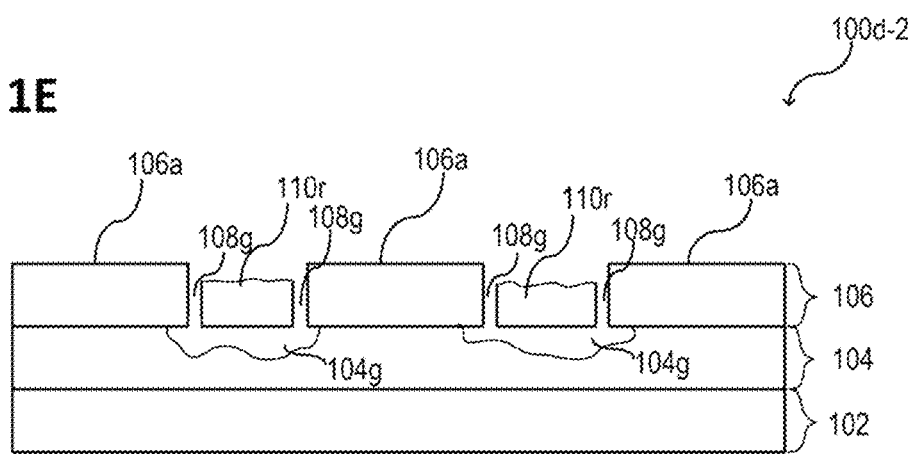

As is illustrated in FIG. 1D, for example, wet-chemically etching 100d-1 can be carried out in such a way that the liner layer 108 is completely removed from the at least one opening 106h before the cover layer 110 is completely removed from the at least one opening 106h. Illustratively, there forms along the liner layer 108 a channel (or a gap or a cavity) 108g extending between the second layer 106 and the remaining section 110r of the cover layer 110 in the direction of the sacrificial layer 104.

Through said channel 108g, the sacrificial layer 104 can already be partly removed by means of the wet-chemically etching 100d-2, that is to say that at least one cavity 104g is formed in the sacrificial layer 104 below the opening 106h even before the cover layer 110 is completely removed from the opening 106h, as is illustrated for example in FIG. 1E.

Illustratively, the sacrificial layer 104 can be at least partly removed before the cover layer 110 is completely removed from the at least one opening 106h. This supports or ensures the residue-free removal of the sacrificial layer 104 below the at least one opening 106h.

Figure 1F:
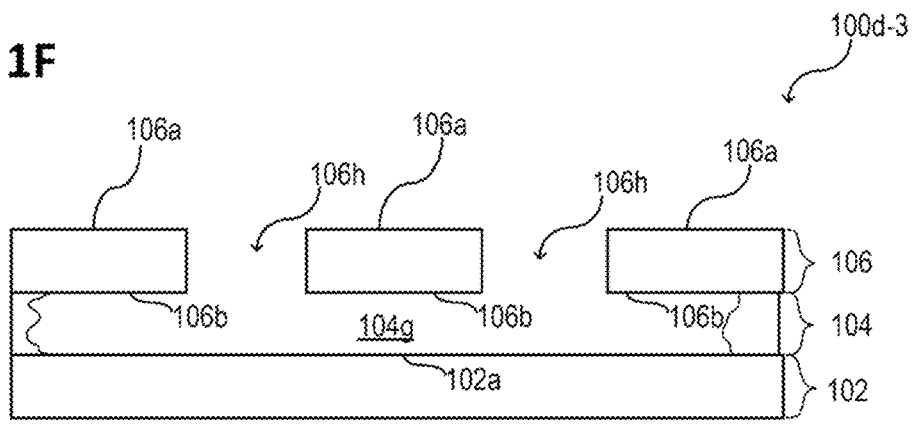
Figure 2B:
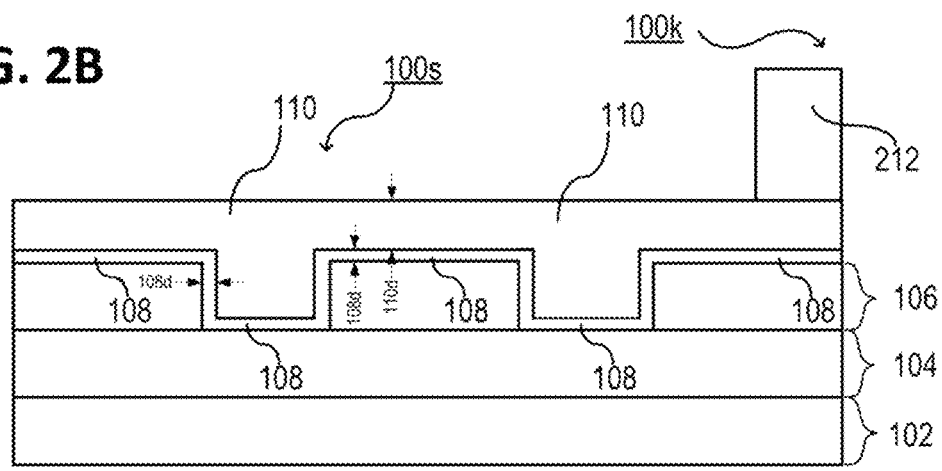
Figure 2C:
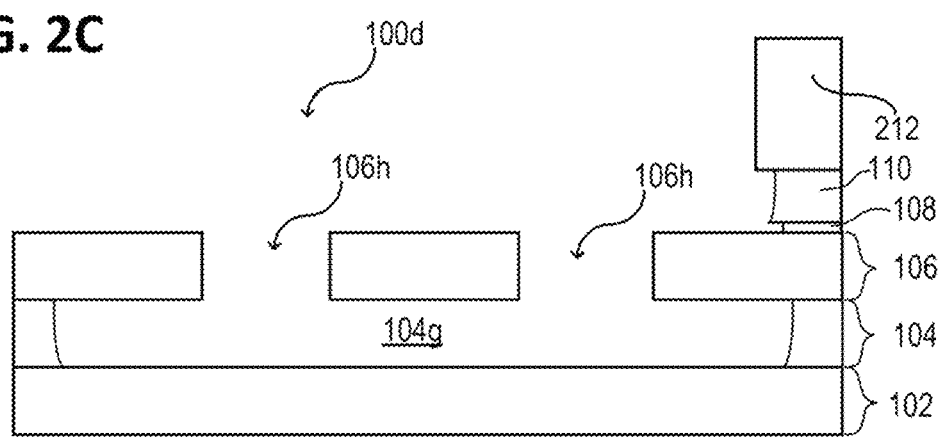

As is illustrated in a schematic side view or cross-sectional view, for example in FIG. 1F and also in FIG. 2C, by means of removing the sacrificial layer 104 during the wet-chemically etching 100d (100d-1 to 100d 3), a cavity 104g can be formed between the two layers 102, 106. In this case, a surface section 102a of the first layer 102 and a surface section 106b of the second layer 106 are exposed in the region below the opening 106h and respectively in a region below and between the plurality of openings 106h.

After the wet-chemically etching 100d-1 to 100d-3, the liner layer 108 and the cover layer no can be completely removed from the at least one opening 106h. The sacrificial layer 104, too, can be completely removed at least in the region below the at least one opening 106h.

At the same time the inner wall 106w of the respective opening 106h is etched free cleanly along the sacrificial layer 104.

As illustrated and described above, a method for processing the layer structure 100 can comprise the following: in 100b, forming a liner layer 108, which covers at least one inner wall 106w of the at least one opening 106h; in 100c, forming a cover layer no above the liner layer 108, wherein the cover layer no extends at least in sections into the at least one opening 106h; and, in 100d (or 100d-1, 100d-2, 100d-3), wet-chemically etching the cover layer no, the liner layer 108 and the sacrificial layer 104 by means of an etching solution, wherein the etching solution has a greater etching rate for the liner layer 108 than for the cover layer 110.

In accordance with various embodiments, the method can furthermore comprise in 100a forming the layer structure 100, wherein the layer structure 100 is correspondingly configured as described above.

Forming the layer structure 100 can comprise the following, for example: depositing a sacrificial layer 104 above (e.g. directly on) a first layer 102 and then depositing a second layer 106 above (e.g. directly on) the sacrificial layer 104. Furthermore, the method for forming the layer structure 100 can comprise structuring for the purpose of forming one opening 106h or a plurality of openings 106h in the second layer 106, wherein the opening(s) 106h expose(s) the sacrificial layer 104 in sections.

In accordance with various embodiments, the layer structure 100 can comprise a structure region 100s and a contacting region 100k laterally alongside one another, such that for example the second layer 106 or both layers 102, 106 can be contacted laterally alongside the cavity 104g produced in the sacrificial layer 104. In this case, the liner layer 108 and the cover layer 110 are arranged above the second layer 106 in the contacting region 100k.

As is illustrated for example in FIG. 2B and FIG. 2C, the layer structure 100 can be structured by means of a mask 212, wherein the mask 212 partly covers the cover layer 110 and wherein the structure region 100s is exposed for the wet-chemically etching 100d, as described above. In accordance with various embodiments, the mask can be a lithographically patterned resist layer.

Figure 3:
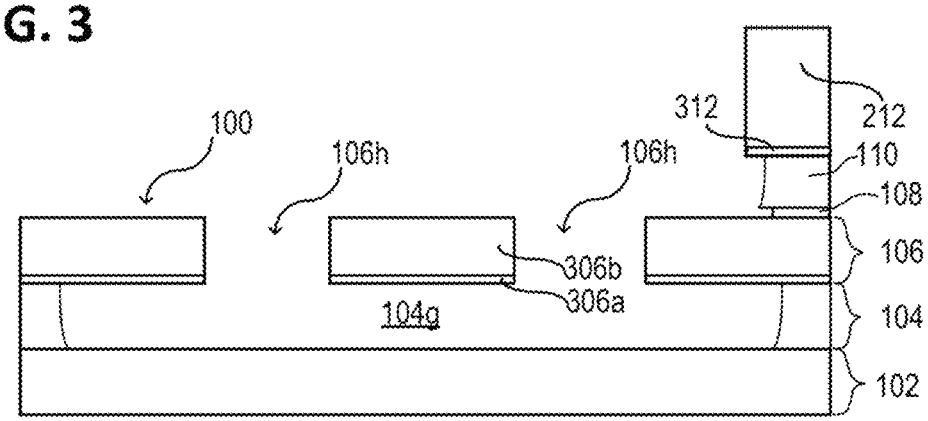
FIG. 3 shows a schematic view of a layer structure after a processing of the layer structure, in accordance with various embodiments.

FIG. 3 illustrates a layer structure 100 in a schematic side or cross-sectional view after processing, in accordance with various embodiments.

In accordance with various embodiments, the second layer 106 can be configured for example as a multilayer with a plurality of plies, e.g. two plies. In this case, the second layer 106 can comprise a first layer ply 306a and a second layer ply 306b arranged above the first layer ply 306a. In accordance with various embodiments, the first layer ply 306a can comprise a nitride, e.g. silicon nitride. In accordance with various embodiments, the second layer ply 306b can comprise a semiconducting material, e.g. silicon, GaAs, SiC, etc. In this case, the second layer ply 306b can have a greater layer thickness than the first layer ply 306a.

Furthermore, a protective layer 312 can be formed between the mask 212 and the cover layer 110. The protective layer can comprise for example a nitride, e.g. silicon nitride.

Figure 4A:
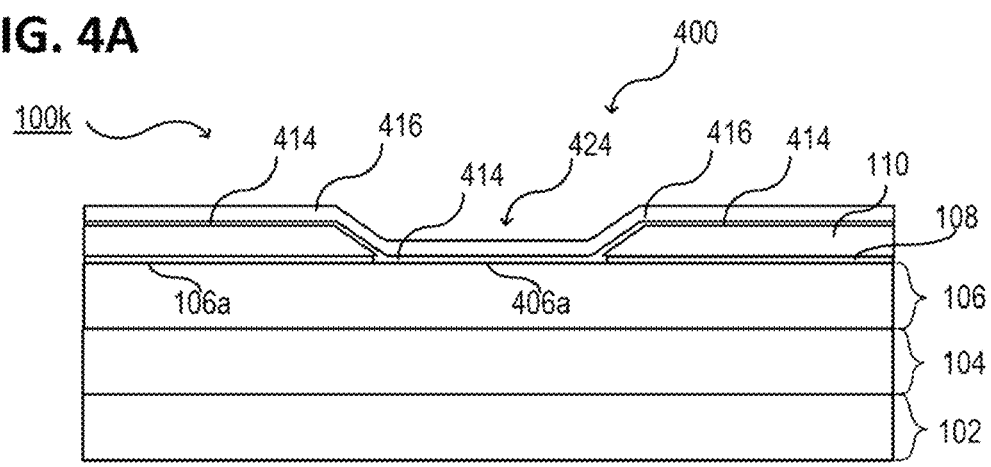
FIGS. 4A and 4B show different schematic views of a microelectromechanical component, in accordance with various embodiments.

FIG. 4A illustrates a contacting region 100k of the layer structure 100 in a schematic side or cross-sectional view, in accordance with various embodiments. By way of example, the contacting region 100k can be part of a microelectromechanical component 400.

In accordance with various embodiments, the microelectromechanical component 400 can comprise a first layer 102 and a second layer 106 arranged above the first layer, wherein a cavity 104g is provided in a structure region 100s of the layer structure 100 between the two layers 102, 106, as described above, for example. In this case, the second layer 106 can be electrically contacted in the contacting region 100k of the layer structure 100, as illustrated for example in FIGS. 4A and 4B.

In accordance with various embodiments, the microelectromechanical component 400 can comprise a liner layer 108, which is arranged above the second layer 106 in the contacting region 100k. Furthermore, the microelectromechanical component 400 can comprise a cover layer 110, which is arranged above the liner layer 108 in the contacting region 100k. The configuration of the liner layer 108 and of the cover layer 110 can be implemented as described above, for example.

In accordance with various embodiments, the liner layer 108 can comprise an undoped oxidic material with a layer thickness of less than 50 nm, e.g. with a layer thickness in a range of approximately 5 nm to approximately 50 nm, e.g. with a layer thickness in a range of approximately 5 nm to approximately 40 nm, e.g. with a layer thickness in a range of approximately 5 nm to approximately 30 nm. The cover layer 110 can comprise for example a doped oxidic material. The cover layer 110 can have for example a greater layer thickness than the liner layer 108.

In accordance with various embodiments, a contact hole 424 can extend through the liner layer 108 and the cover layer 110 as far as the second layer 106 for the purpose of electrically contacting a surface section 406a of the second layer 106. In accordance with various embodiments, the contact hole 424 can have an inner wall 424w (also referred to as side wall or inner circumferential wall) which is beveled.

In accordance with various embodiments, an electrically conductive diffusion barrier layer 414 can be formed, which partly or completely covers the cover layer 110, the inner wall 424w of the contact hole 424 and the surface section 406a of the second layer 106. In accordance with various embodiments, a metal layer 416 arranged above the diffusion barrier layer 414 can be used for contacting the second layer 106 through the contact hole 424.

Figure 4B:
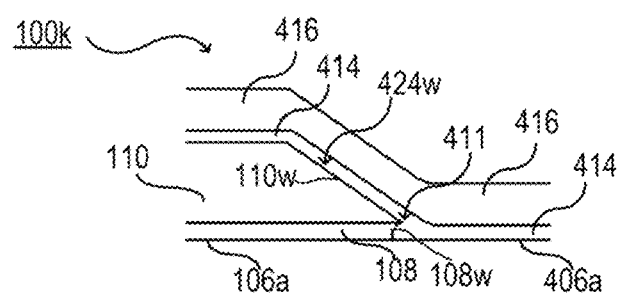

FIG. 4B shows a schematic detail illustration of the microelectromechanical component 400 in the region of the inner wall 424w of the contact hole 424, in accordance with various embodiments.

In accordance with various embodiments, the cover layer 110 can have a beveled side surface 11ow that forms a part of the contact hole 424. Furthermore, the liner layer 108 can have a side surface 108w that forms a further part of the contact hole 424. By virtue of the fact that the liner layer 108 is made very thin, it is possible to prevent the diffusion barrier layer 414 from being torn away in the boundary region 411 between the liner layer 108 and the cover layer 110 at the contact hole 424, such that no material of the metal layer 416 arranged above the diffusion barrier layer 414 can diffuse into the second layer 106 or bond chemically to the material of the second layer 106.

The diffusion barrier layer 414 can be prevented from being torn away essentially by virtue of the fact that an undercutting of the cover layer 110 into the liner layer 108, on account of the small layer thickness of the liner layer 108, can substantially be prevented or can be kept within an acceptable range.

In accordance with various embodiments the second layer 106 can comprise silicon. The metal layer 416 for contacting the second layer 106 can comprise a metal (e.g. gold) which reacts with the silicon of the second layer 106 to form a metal silicide (e.g. gold silicide). In this case, the diffusion barrier layer 414 can comprise a material (e.g. titanium and/or platinum) which substantially prevents a diffusion of the metal of the metal layer 416 into the second layer 106 and is chemically stable vis-à-vis the second layer 106 and the metal layer 416.

In accordance with various embodiments, the liner layer 108 can comprise an undoped silicon oxide, as described above, and the cover layer can comprise a doped silicon oxide (e.g. BPSG), as described above.

The method described herein, in accordance with various embodiments, describes a possibility for eliminating various reliability and defect density problems during the production of both MEMS and electrical component structures.

In this case, it is possible to use a dielectric layer stack in which an oxide liner 108 is deposited below a BPSG layer 110, wherein the oxide liner performs for example both the function of a diffusion stop of possible dopants into the basic substrate/component (e.g. into the layers 102, 106) and the function of an etching accelerator (etching promoter) in the course of etching free perforated MEMS structures 106, 106h.

In accordance with various embodiments, an elimination (or at least a reduction) of optical defects (e.g. discolorations) and physical defects (e.g. residues, e.g. an $SiO_x$ layer) can be realized by means of the implementation of the oxide liner 108, wherein the oxide liner 108 is arranged in such a way that it has virtually no negative influence on the component. The oxide liner 108 forms characteristic etching edges at contact holes or the like.

In accordance with various embodiments, a BPSG cover layer 110 in a component structure can function as intermediate oxide or planarization material. The oxide liner 108 can be deposited before the BPSG deposition.

In accordance with various embodiments, the first layer 102 can be a substrate, e.g. an Si substrate, a Ge substrate, a GaAs substrate, an Si/Ge substrate, an SiC substrate, a GaN substrate, or some other III or V semiconductor substrate.

The deposition of the oxide liner 108 (e.g. comprising or consisting of an undoped oxide) is carried out for example before the BPSG deposition with a layer thickness in a range of approximately 10 nm to approximately 300 nm, or in a range of approximately 5 nm to approximately 50 nm, or in a range of approximately 5 nm to approximately 30 nm.

The deposition (in other words the depositing) of the BPSG (boron (B) and phosphorus (P)-doped silicon oxide (BPSG)) layer on the liner can be carried out for example with a layer thickness in a range of approximately 100 nm to approximately 20 m. After the deposition of the BPSG layer, a flowing/anneal of the BPSG layer can be carried out.

In accordance with various embodiments, the deposition of the liner layer 108 and of the cover layer 110 can be carried out by means of CVD methods (e.g. PE-CVD, LP-CVD, SA-CVD, AP-CVD, or HDP-CVD). In accordance with various embodiments, the liner layer 108 can comprise an undoped oxide, e.g. $SiO_x$ where $0<x\leq2$).

In accordance with various embodiments, the oxide liner 108 can be an LP-CVD TEOS liner. The oxide liner 108 functions both as a diffusion barrier vis-à-vis the typical dopants and dopant concentrations and as an etching accelerator in the course of etching free perforated structures. Alternatively, instead of a BPSG, it is also possible to use a BSG or PSG, with a layer thickness in a range of, for example, approximately 100 nm to approximately m.

In accordance with various embodiments, the implementation of an oxide liner 108 and the influence thereof on the reliability and defect density are described on the basis of the example of a MEMS structure (e.g. a microphone structure). The exemplary, schematic drawings mentioned serve here only for illustrating the basic principle and show only the component structures or method steps necessary for understanding said basic principle. The structures illustrated in the graphic depictions are not necessarily true to scale.

In accordance with various embodiments, the use of the oxide liner 108 as described herein can likewise be used in the production of purely electrical components.

The liner layer 108 described herein has for example the function of preventing a possible diffusion of dopants from the cover layer 110, in particular during the annealing/flowing of a BPSG cover layer 110, without altering the flow properties of the BPSG in the process.

A negative influence of possibly outdiffusing dopants on the underlying layers or on the underlying substrate is thereby eliminated, for example, or at least reduced (e.g. the homogeneity of electrical parameters is also improved as a result). Furthermore, the liner layer 108 acts illustratively as an etching promoter on account of its higher etching rate vis-à-vis the cover layer 110. In the course of wet-chemically etching the cover layer 110, e.g. a BPSG cover layer (e.g. with an HF-based etching solution), the liner layer 108 is removed more rapidly. This both enables an early lateral etch of the cover layer 110 and ensures an earlier etch of underlying layers (e.g. of the sacrificial layer 104).

FIGS. 1A to 3 illustrate in each case the position of the oxide liner 108 within a dielectric layer stack, and also the function thereof as an etching accelerator when wet-chemically etching BPSG and other oxides within a MEMS structure.

In accordance with various embodiments, on account of the liner layer 108, a lateral and vertical access is produced in the course of wet-chemically etching free perforated structures as soon as the wet-chemical etch reaches the oxide liner 108. This is caused by the increased etching rate of the liner oxide 108 vis-à-vis the cover layer 110. Consequently, even perforated structures can be etched free without any residues, e.g. can be freed of the material of a sacrificial layer 104.

In accordance with various embodiments, the second layer 106 forms a part of a MEMS structure. A section of the second layer 106 is freed for example by means of the cavity 104g produced below the second layer 106, wherein the freed section of the second layer 106 is held laterally (in other words is clamped in). In this case, a notch formation in the clamping-in region can be characteristic of the higher etching rate of the liner oxide, as a result of which a lateral undercut (under the cover layer 110) is generated.

The oxide liner 108 can, in accordance with various embodiments, be formed with a sufficient thickness to prevent an outdiffusion of the dopants and thus a doping of underlying layers or of the substrate material. In this case, the necessary thickness for the oxide layer 108 in order to function as a diffusion barrier generally depends on the dopant concentration of the cover layer 110 (e.g. of the BPSG material). With typical concentration values of, for example, 5% phosphorus and 4% boron, the oxide liner 108 can have a minimum thickness of 10 nm. At the same time, the thickness of the oxide layer 108 supports the capillary forces acting in the course of etching free perforated structures.

In accordance with various embodiments, the liner layer 108 and the cover layer 110 can be produced by means of an in-situ deposition, i.e. illustratively within the same coating apparatus, wherein the undoped oxide liner 108 is deposited as USG directly before the BPSG deposition of the cover layer 110 by means of the same method.

In accordance with various embodiments, the oxide liner 108 can be generated by means of a thermal method, e.g. oxidation of Si, directly on the support (e.g. a substrate or a layer), provided that the process temperatures necessary for this purpose are permissible for the component. Alternatively, a BSG or PSG can also be used instead of a BPSG.

In accordance with various embodiments, the liner layer 108 can be implemented by means of LP-CVD deposition, which by comparison with methods such as PE-CVD and SA-CVD deposition, for example, enables a reproducible deposition even of very thin oxide layers, e.g. oxide layers having a layer thickness of 5 nm to 50 nm.

As an alternative or in addition to a pure oxide, it is also possible to use other liner materials such as, for example, $Si_3N_4$ or SiON as a diffusion stop. Layer stacks (e.g. a so-called ONO layer stack→oxide/nitride/oxide) are also conceivable. In these cases, however, the advantage of the liner of acting as a kind of etching accelerator may be reduced or even omitted, since these materials generally have a lower etching rate in HF-based solutions.

In accordance with various embodiments, BPSG comprising a mixture of oxides and hydrides of silicon (e.g. $SiH_4$), of boron ($B_2H_6$) and of phosphorus ($PH_3$) can be produced as a precursor in a CVD deposition. In accordance with various embodiments, PSG comprising a mixture of $POCl_3$, oxygen ($O_2$) and nitrogen ($N_2$) can be produced as a precursor in a CVD deposition. In accordance with various embodiments, USG can be deposited by means of CVD at low temperatures.

In accordance with various embodiments, an HF solution buffered with ammonium fluoride ($NH_4F$) can be used as etching solution in order to keep the etching characteristic constant. At the same time, creeping under resist masks and the like can thereby be avoided or reduced.

The respective etching rate of the liner layer 108 and of the cover layer 110 can be dependent for example on the impermeability and the stoichiometry of the oxides respectively used. In the case of doped oxides, the type of impurity atoms is crucial for the etching rate. The etching rate decreases e.g. in the case of high boron dopings and increases e.g. in the case of phosphorus dopings. An HF-based etching solution is selective with respect to pure silicon, which is substantially not attacked at room temperature (e.g. 25° C.). Furthermore, a chemically neutral wetting agent, e.g. comprising fluorine-carbon compounds, can be added to the etching solution, for example.

As is illustrated in FIG. 4B, for example, the increased etching rate of the liner layer 108 leads to an increased lateral undercut in the contact region 100k, and thus to a formation of negative side walls 108w in the contact hole 424. This can result in an interruption of the (e.g. Ti/Pt) diffusion barrier 414 if the liner layer 108 is too thick (e.g. has a layer thickness of more than 50 nm). A direct contact between the metal layer 416 (e.g. the bond metal) and the second layer 106 (e.g. composed of silicon or polysilicon) then entails the risk of alloying of the materials and a weakening of the contact region.

Figure 5:
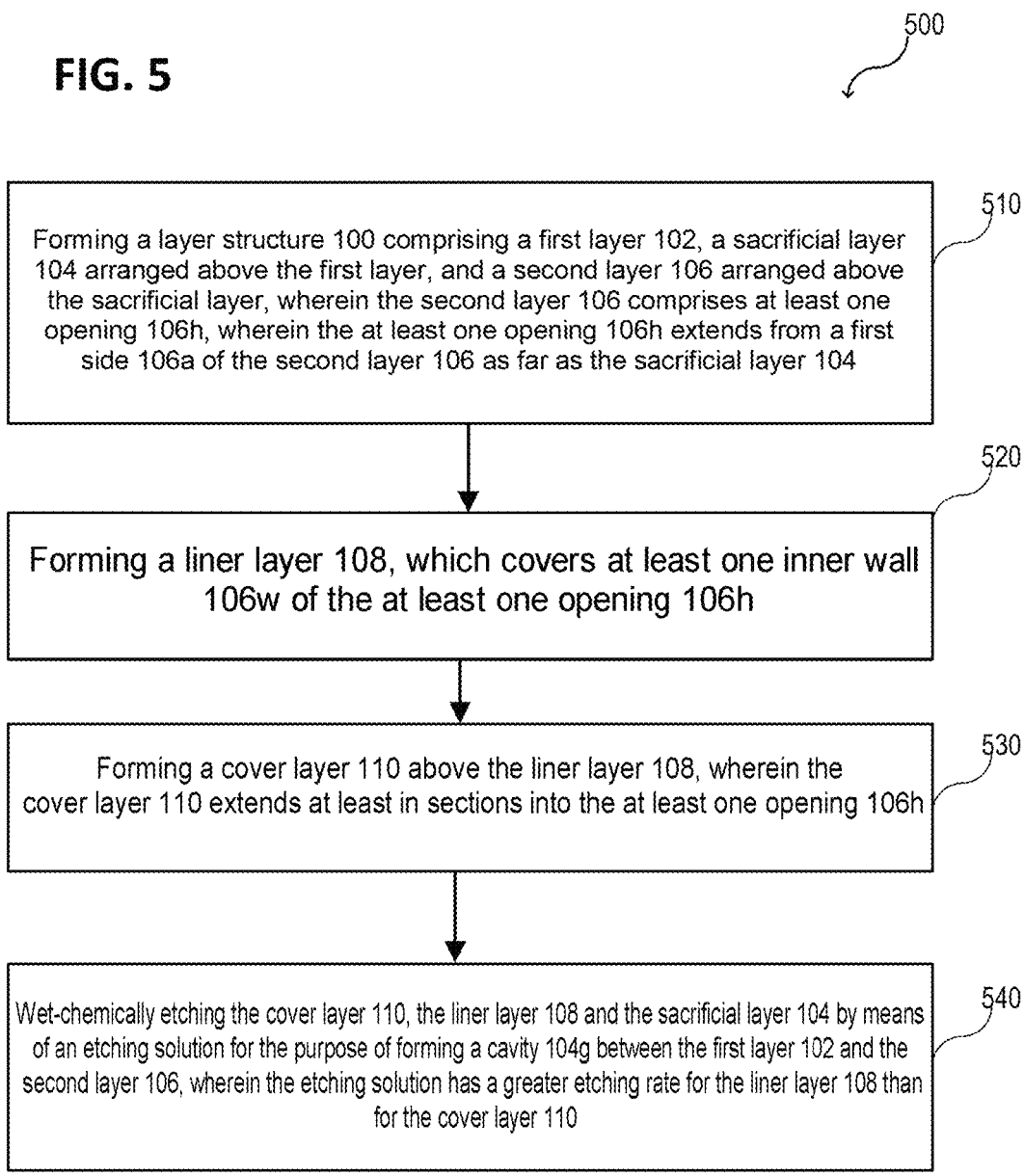
FIG. 5 shows a schematic flow diagram of a method for processing a layer structure, in accordance with various embodiments.

FIG. 5 illustrates a method 500 for processing a layer structure (e.g. for processing a MEMS structure) in a schematic flow diagram, in accordance with various embodiments. The method 500 can comprise the following, for example: in 510, forming a layer structure 100 comprising a first layer 102, a sacrificial layer 104 arranged above the first layer, and a second layer 106 arranged above the sacrificial layer, wherein the second layer 106 comprises at least one opening 106h, wherein the at least one opening 106h extends from a first side 106a of the second layer 106 as far as the sacrificial layer 104; in 520, forming a liner layer 108, which covers at least one inner wall 106w of the at least one opening 106h; in 530, forming a cover layer 110 above the liner layer 108, wherein the cover layer 110 extends at least in sections into the at least one opening 106h; and in 540, wet-chemically etching the cover layer 110, the liner layer 108 and the sacrificial layer 104 by means of an etching solution in order to form a cavity 104g between the first layer 102 and the second layer 106, wherein the etching solution has a greater etching rate for the liner layer 108 than for the cover layer 110. In accordance with various embodiments, the method 500 can be carried out in such a manner as has been described above on the basis of the example of the layer structure 100.

Subsequently, FIGS. 6A to 6C and 7A to 7C illustrate in each case a MEMS structure comprising at least one layer structure, in accordance with various embodiments. The at least one layer structure of the respective MEMS structure can be configured and/or formed for example in a similar or identical manner to that as described above with respect to the layer structure 100, and vice versa. In accordance with various embodiments, the MEMS structure can be a microelectromechanical component, or be at least part of a microelectromechanical component, e.g. in a similar manner to that as described with regard to FIGS. 4A and 4B.

Figure 6A:
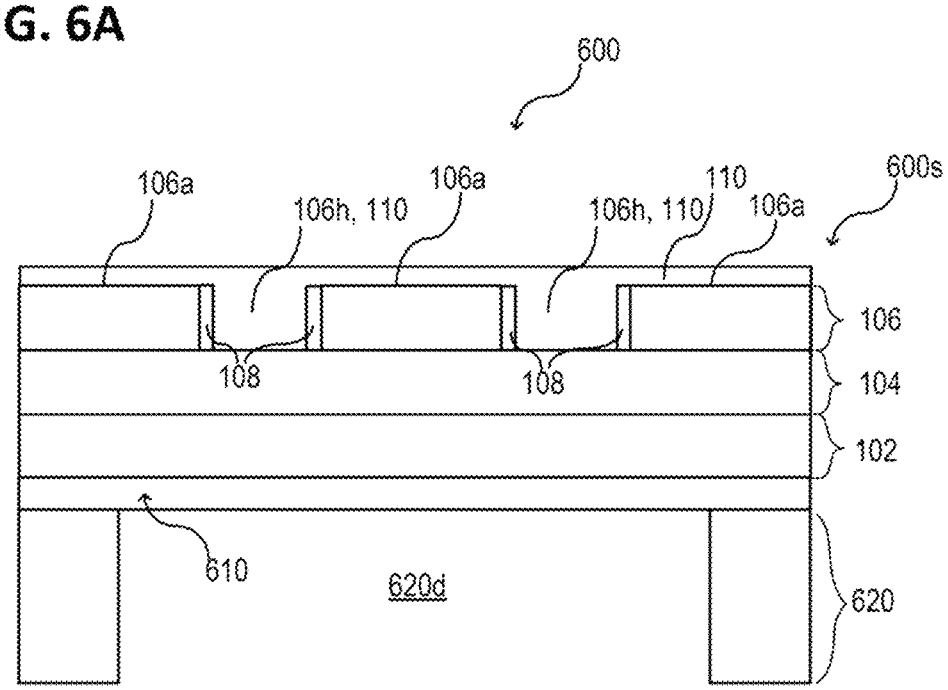
FIGS. 6A to 6C show various schematic views of a microelectromechanical structure, in accordance with various embodiments.

FIG. 6A illustrates a MEMS structure 600 in a schematic cross-sectional view, in accordance with various embodiments. The MEMS structure 600 can, for example, comprise a layer structure 600s, which is formed above a carrier substrate 620 for carrying the layer structure 600s.

The carrier substrate 620 can be for example a semiconductor wafer (e.g. a silicon wafer), a semiconductor chip (e.g. a silicon chip), or some other suitable carrier. The carrier substrate 620 can have for example a thickness in a range of approximately 50 μm to approximately 1 mm.

The carrier substrate 620 can comprise an opening 62od, for example, above which the layer structure 600s can be arranged or can be formed, analogously to the description given above. For the purpose of forming the layer structure 600s above the opening 62od, an auxiliary layer 610 can be used, for example, which can be arranged between the carrier substrate 620 and the layer structure 600s. The auxiliary layer 610 can have for example a layer thickness in a range of approximately 100 nm to approximately 3 μm. The auxiliary layer 610 can be configured as a sacrificial layer, for example, that is to say that the latter can be removed at least in sections at a later point in time in order to make a part of the layer structure 600s accessible (see FIG. 6B, for example). The auxiliary layer 610 can be for example an oxide layer e.g. a silicon oxide layer, e.g. an LPCVD TEOS layer.

In accordance with various embodiments, the layer structure 600s of the MEMS structure 600 can comprise the following, for example: a first layer 102 (e.g. a membrane layer), a sacrificial layer 104 arranged above the first layer 102, and a second layer 106 (e.g. an electrode layer) arranged above the sacrificial layer 104. The second layer 106 can, for example as described above, comprise at least one opening 106h, wherein the at least one opening 106h extends from a first side 106a of the second layer 106 as far as the sacrificial layer 104. Furthermore, the layer structure 600s can comprise a liner layer 108, which covers at least one inner wall 106w of the at least one opening 106h. Furthermore, the layer structure 600s can comprise a cover layer 110 arranged above the liner layer 108, wherein the cover layer 110 extends at least in sections into the at least one opening 106h. The liner layer 108 can, in accordance with various embodiments, also cover, in addition to the inner wall 106w of the at least one opening 106h, that section of the sacrificial layer 104 which is exposed toward the opening 106h (see FIGS. 1C and 2B, for example).

The first layer 102 of the layer structure 600s can be a membrane layer, for example. In this case, the MEMS structure 600 can be a microphone structure or part of a microphone structure. In this case, the membrane layer can be uncovered on both sides at least in sections, e.g. by means of the sacrificial layer 104 and the auxiliary layer 610 being removed in sections. In this case, the cover layer 110 and the liner layer 108 can also be removed in sections, as described above.

Figure 6B:
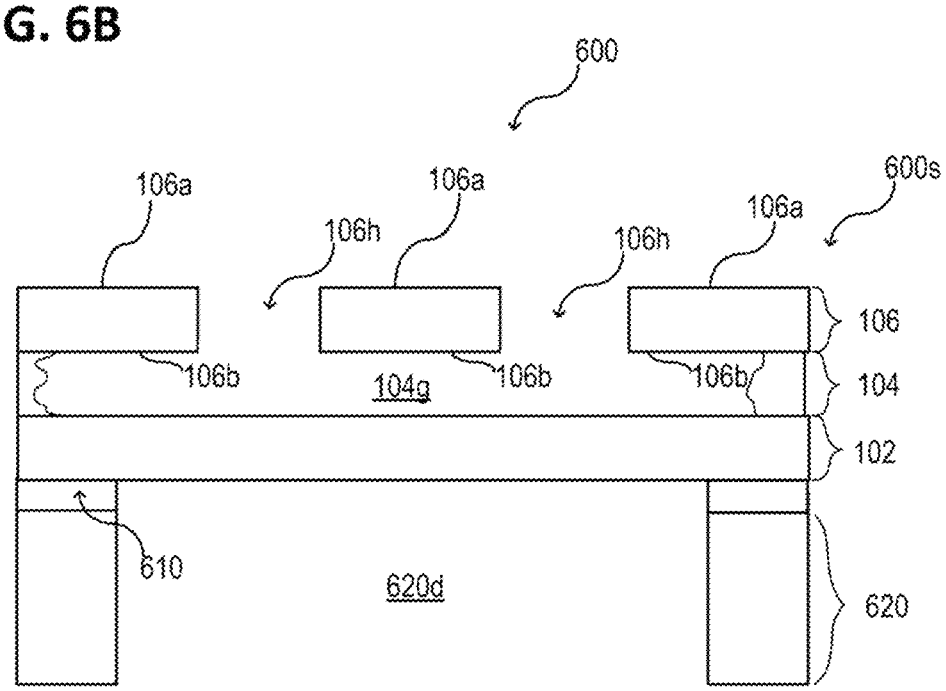

FIG. 6B illustrates the MEMS structure 600 illustrated byway of example in FIG. 6A in a schematic cross-sectional view, in accordance with various embodiments, after the first layer 102 (e.g. the membrane layer) has been uncovered at least in sections. In this case, it is possible for a cavity 104g to be formed, e.g. in a similar or identical manner to that as described above. Furthermore, it is also possible for the auxiliary layer 610 to be removed in sections, e.g. by means of etching, such that at least one section of the first layer 102 is exposed on both sides.

An oscillation of the membrane layer can be determined for example from the position changes thereof relative to the second layer 106. The second layer 106 can be configured for example as an electrode layer (also referred to as a perforated backplate), e.g. can comprise electrically conductive material. In accordance with various embodiments, the first layer 102 and the second layer 106 can both be electrically contacted (see also FIGS. 4A and 4B). Illustratively, a capacitive microphone structure can be formed, wherein the first layer 102 functions as a membrane layer of the microphone structure.

The membrane layer 102 can have for example a layer thickness in a range of approximately 0.1 µm to approximately 10 µm, e.g. in a range of approximately 0.1 m to approximately 2 µm, e.g. in a range of approximately 0.1 µm to approximately 0.5 µm.

In accordance with various embodiments, the second layer 106 can be configured as a multilayer; e.g. the latter can comprise an electrically conductive layer arranged between two electrically insulating layers.

Figure 6C:
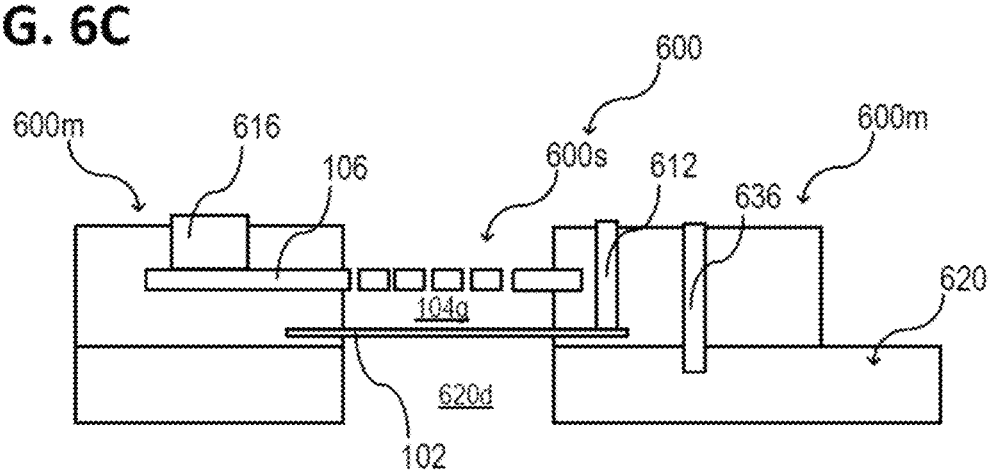

FIG. 6C illustrates a MEMS structure 600 in a schematic cross-sectional view, in accordance with various embodiments. In this case, the respective layers 102, 106 of the MEMS structure 600 can be electrically contacted by means of a metallization structure 600m. In accordance with various embodiments, the first layer 102 can be contacted by means of a first contact structure 612. Furthermore, the second layer 106 can be contacted by means of a second contact structure 616.

In accordance with various embodiments, the carrier substrate 620 can furthermore be electrically contacted by means of a further contact structure 636.

Figure 7A:
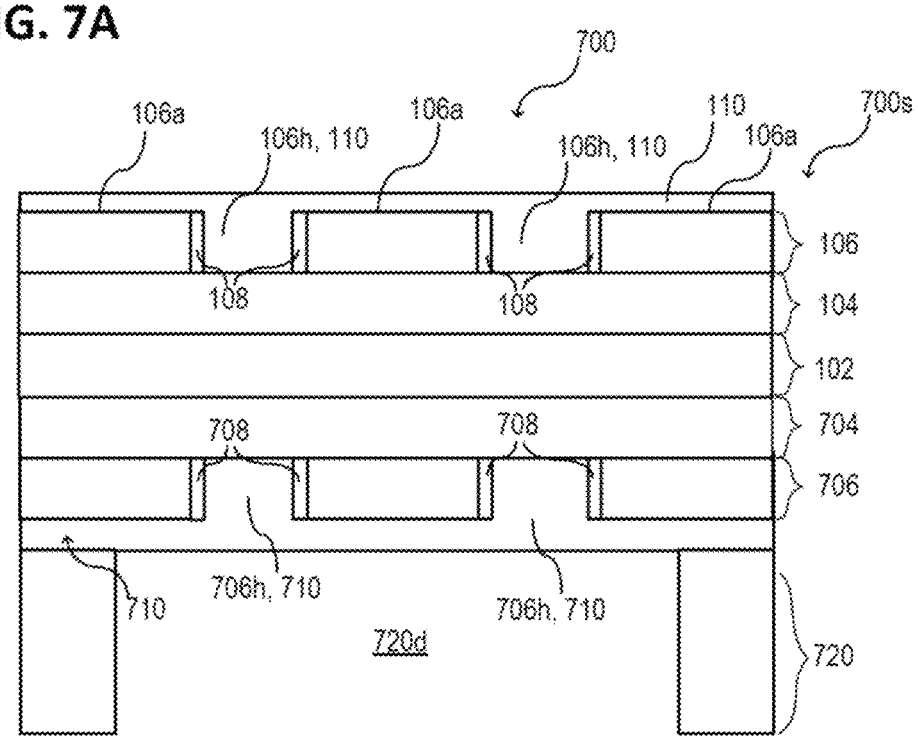
FIGS. 7A to 7C show various schematic views of a microelectromechanical structure, in accordance with various embodiments.

FIG. 7A illustrates a MEMS structure 700 in a schematic cross-sectional view, in accordance with various embodiments. The MEMS structure 700 can, for example, comprise a layer structure 700s, which is formed above a carrier substrate 720 for carrying the layer structure 700s. The carrier substrate 720 can be for example a semiconductor wafer (e.g. a silicon wafer), a semiconductor chip (e.g. a silicon chip), or some other suitable carrier. The carrier substrate 720 can have for example a thickness in a range of approximately 50 µm to approximately 1 mm.

The carrier substrate 720 can comprise an opening 72od, for example, above which the layer structure 700s can be arranged or can be formed.

The layer structure 700s of the MEMS structure 700 can comprise the following, for example: a first layer 102, a first sacrificial layer 104 arranged above the first layer 102, and a second layer 106 arranged above the first sacrificial layer 104, wherein the second layer 106 comprises at least one opening 106h, wherein the at least one opening 106h of the second layer 106 extends from a first side 106a of the second layer 106 as far as the first sacrificial layer 104. Furthermore, the layer structure 700s can comprise a first liner layer 108, which covers at least one inner wall 106w of the at least one opening 106h of the second layer 106. Furthermore, the layer structure 700s can comprise a cover layer 110 arranged above the first liner layer 108. In this case, the cover layer 110 can extend at least in sections into the at least one opening 106h of the second layer 106. The first liner layer 108 can, in accordance with various embodiments, also cover, in addition to the inner wall 106w of the at least one opening 106h of the second layer 106, that section of the first sacrificial layer 104 which is exposed toward the opening 106h (see FIGS. 1C and 2B).

The layer structure 700s can be constructed mirror-symmetrically with respect to the first layer 102 with regard to its layer sequence (sacrificial layer 104/second layer 106/liner layer 108/cover layer 110). In other words, the layer structure 700s can additionally comprise the following: a second sacrificial layer 704 arranged below the first layer 702, a third layer 706 arranged below the second sacrificial layer 704, wherein the third layer 706 comprises at least one opening 706h, wherein the at least one opening 706h extends from a first side 706a of the third layer 706 as far as the second sacrificial layer 704. Furthermore, the layer structure 700s can additionally comprise a second liner layer 708, which covers at least one inner wall 706w of the at least one opening 706h of the third layer 706. Furthermore, the layer structure 700s can additionally comprise a second cover layer 710, which covers the second liner layer 708 and is arranged between the carrier substrate 720 and the second sacrificial layer 704. In this case, the second cover layer 710 can extend at least in sections into the at least one opening 706h of the third layer 706.

In this case, the second sacrificial layer 704 can be configured in an identical or similar manner to the first sacrificial layer 104. Furthermore, the third layer 706 can be configured in an identical or similar manner to the second layer 106. Furthermore, the second liner layer 708 can be configured in an identical or similar manner to the first liner layer 108. Furthermore, the second cover layer 710 can be configured in an identical or similar manner to the first cover layer 110.

The first layer 102 of the layer structure 700s can be a membrane layer, for example. In this case, the MEMS structure 700 can be a microphone structure or part of a microphone structure after the membrane layer has been uncovered at least in sections, e.g. by means of the first and second sacrificial layers 104, 704 being removed in sections. In this case, the first and second cover layers 110, 720 and the first and second liner layers 108, 708 can also be removed in sections.

Figure 7B:
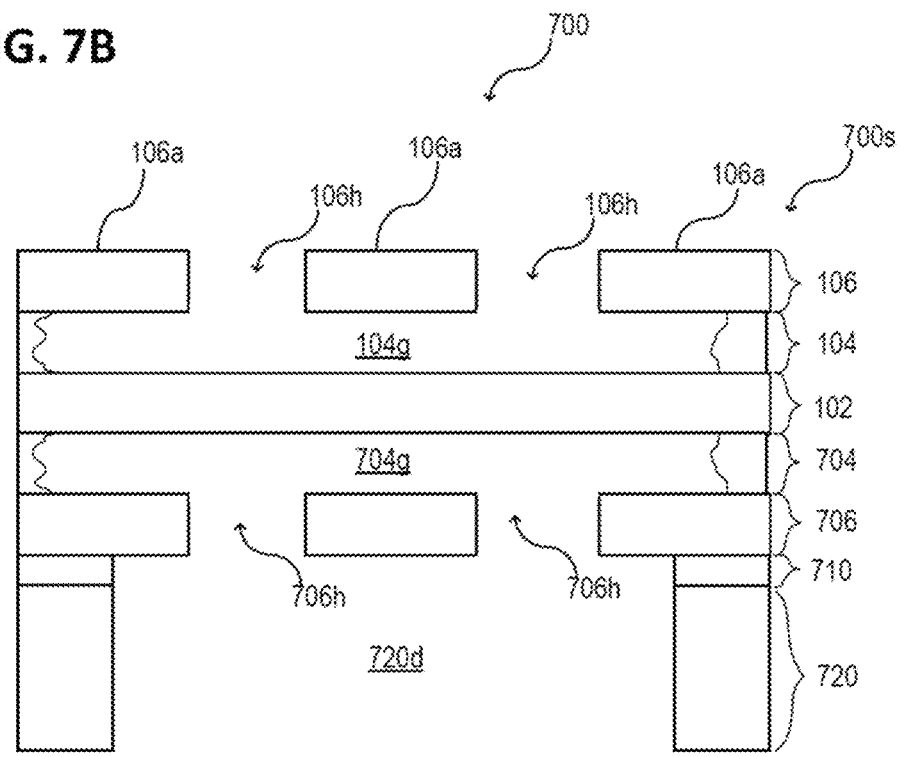

FIG. 7B illustrates the MEMS structure 700 in a schematic cross-sectional view, in accordance with various embodiments, after the first layer 102 (e.g. the membrane layer) has been exposed at least in sections. In this case, a first cavity 104g and a second cavity 704g have been formed, e.g. in a similar or identical manner to that as described above. In this case, by way of example, the first sacrificial layer 104 and the second sacrificial layer 704, the first cover layer 110 and the second cover layer 720, and the first liner layer 108 and the second liner layer 708 are removed in sections, e.g. by means of etching, such that the first layer 102 is exposed on both sides at least in sections.

An oscillation of the first layer 102 (e.g. of the membrane layer) can be determined for example from the position changes thereof relative to the second layer 106 and/or the third layer 706. The second layer 106 and/or the third layer 706 can be configured as electrode layers (also referred to as a perforated dual backplate). To that end, the first layer 102, the second layer 106 and the third layer 706 can be electrically contacted (see also FIGS. 4A and 4B). Illustratively, a capacitive microphone structure can be formed, wherein the first layer 102 serves as a membrane layer of the microphone structure.

The membrane layer 102 can have for example a layer thickness in a range of approximately 0.1 µm to approximately 10 µm, e.g. in a range of approximately 0.1 m to approximately 2 µm, e.g. in a range of approximately 0.1 µm to approximately 0.5 µm.

In accordance with various embodiments, the second layer 106 can be configured as a multilayer; e.g. the latter can comprise an electrically conductive layer arranged between two electrically insulating layers. In accordance with various embodiments, the third layer 706 can be configured as a multilayer; e.g. the latter can comprise an electrically conductive layer arranged between two electrically insulating layers.

In accordance with various embodiments, the respective layer structure 600s, 700s of the MEMS structure 600, 700 can comprise a structure region and a contacting region laterally alongside one another, such that for example the respective layers 102, 106, 706 can be contacted laterally alongside the cavity 104g, 704g produced in the respective sacrificial layer 104, 704.

Figure 7C:
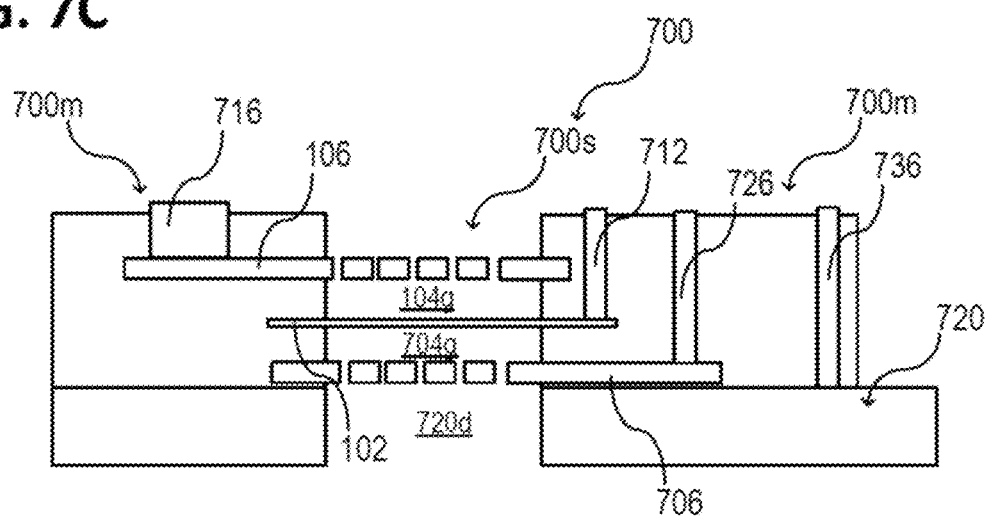

FIG. 7C illustrates a MEMS structure 700 in a schematic cross-sectional view, in accordance with various embodiments. In this case, the respective layers 102, 106, 706 of the MEMS structure 700 can be electrically contacted by means of a metallization structure 700m. In accordance with various embodiments, the first layer 102 can be contacted by means of a first contact structure 712. Furthermore, the second layer 106 can be contacted by means of a second contact structure 716. Furthermore, the third layer 706 can be contacted by means of a third contact structure 726.

In accordance with various embodiments, the carrier substrate 720 can furthermore be electrically contacted by means of a further contact structure 736.

A description is given below of various examples which relate to the description and illustration above.

Example 1 is a method comprising: forming a layer structure 100 comprising a first layer 102, a sacrificial layer 104 arranged above the first layer, and a second layer 106 arranged above the sacrificial layer, wherein the second layer 106 comprises at least one opening 106h, wherein the at least one opening 106h extends from a first side 106a of the second layer 106 as far as the sacrificial layer 104; forming a liner layer 108, which covers at least one inner wall 106w of the at least one opening 106h; forming a cover layer 110 above the liner layer 108, wherein the cover layer 110 extends at least in sections into the at least one opening 106h; and wet-chemically etching the cover layer 110, the liner layer 108 and the sacrificial layer 104 by means of an etching solution for the purpose of forming a cavity 104g between the first layer 102 and the second layer 106, wherein the etching solution has a greater etching rate for the liner layer 108 than for the cover layer 110.

As an alternative thereto, example 1 is a method for processing a carrier, the method comprising: forming a layer structure 100 comprising a first layer 102, a sacrificial layer 104 arranged above the first layer, and a second layer 106 arranged above the sacrificial layer, wherein the second layer 106 comprises at least one opening 106h, wherein the at least one opening 106h extends from a first side 106a of the second layer 106 as far as the sacrificial layer 104; covering at least one inner wall 106w of the at least one opening 106h by means of a liner layer 108; forming a cover layer 110 above the liner layer 108, wherein the cover layer 110 extends at least in sections into the at least one opening 106h; and wet-chemically etching the cover layer 110, the liner layer 108 and the sacrificial layer 104 by means of an etching solution for the purpose of forming a cavity 104g between the first layer 102 and the second layer 106, wherein the etching solution has a greater etching rate for the liner layer 108 than for the cover layer 110.

As an alternative thereto, example 1 is a method for processing a carrier, the method comprising: forming a layer structure 100 comprising a first layer 102, a sacrificial layer 104 arranged above the first layer, and a second layer 106 arranged above the sacrificial layer, wherein the second layer 106 comprises at least one opening 106h, wherein the at least one opening 106h extends from a first side 106a of the second layer 106 as far as the sacrificial layer 104; depositing a liner layer 108, wherein the liner layer 108 comprises a first material and covers at least one inner wall 106w of the at least one opening 106h; depositing a cover layer 110 above the liner layer 108, wherein the cover layer 110 comprises a second material and extends at least in sections into the at least one opening 106h; and wet-chemically etching the cover layer 110, the liner layer 108 and the sacrificial layer 104 by means of an etching solution for the purpose of forming a cavity 104g between the first layer 102 and the second layer 106, wherein the etching solution has a greater etching rate for the first material than for the second material.

The above-described first layer 102 and second layer 106 of the layer structure 100 can be for example a first layer 102 and a second layer 106 of a common carrier. The above-described first layer 102 and second layer 106 of the layer structure 100 can be for example a first layer 102 and a second layer 106 of a common MEMS structure, e.g. of a microphone structure or of some other pressure sensor structure.

Example 1 is a method for processing a layer structure 100, wherein the layer structure 100 comprises a first layer 102, a sacrificial layer 104 arranged above the first layer 102, and a second layer 106 arranged above the sacrificial layer 104, wherein the second layer 106 comprises at least one opening 106h, wherein the at least one opening 106h extends from a first side 106a of the second layer 106 as far as the sacrificial layer 104, wherein the method comprises: forming a liner layer 108, which covers at least one inner wall 106w of the at least one opening 106h; forming a cover layer 110 above the liner layer 108, wherein the cover layer 110 extends at least in sections into the at least one opening 106h; and wet-chemically etching the cover layer 110, the liner layer 108 and the sacrificial layer 104 by means of an etching solution, wherein the etching solution has a greater etching rate for the liner layer 108 than for the cover layer 110.

In example 2, the method in accordance with example 1 can optionally comprise the fact that the wet-chemically etching comprises completely removing the liner layer 108 from the at least one opening 106h and at least partly removing the sacrificial layer 104 before the cover layer 110 is completely removed from the at least one opening 106h.

In example 3, the method in accordance with example 1 or 2 can optionally comprise the fact that the wet-chemically etching comprises completely removing the liner layer 108 and the cover layer 110 from the at least one opening 106h, and completely removing the sacrificial layer 104 in a region below the at least one opening 106h.

In example 4, the method in accordance with any of examples 1 to 3 can optionally comprise the fact that the wet-chemically etching comprises forming a cavity 104g between the first layer 102 and the second layer 106, wherein a surface section 102a of the first layer 102 and a surface section 106b of the layer 106 are exposed.

In example 5, the method in accordance with any of examples 1 to 4 can optionally comprise the fact that forming the liner layer 108 is carried out in such a way that the liner layer 108 is furthermore arranged above the second layer 106 at least in sections in a region outside the at least one opening 106h, and wherein forming the cover layer 110 above the liner layer 108 is carried out in such a way that the cover layer 110 is arranged above the liner layer 108 in the region outside the at least one opening 106h.

In example 6, the method in accordance with any of examples 1 to 5 can optionally comprise the fact that the liner layer 108 comprises an undoped oxidic material, preferably undoped silicon oxide; and that the cover layer 110 comprises a doped oxidic material, preferably doped silicon oxide.

In example 7, the method in accordance with any of examples 1 to 6 can optionally comprise the fact that the cover layer 110 comprises phosphorus doped oxidic material, preferably phosphorus doped silicon oxide; or that the cover layer 110 comprises oxidic material, preferably silicon oxide, which is doped with boron and phosphorus.

In example 8, the method in accordance with any of examples 1 to 7 can optionally comprise the fact that the etching solution is a hydrofluoric acid-based etching solution.

In example 9, the method in accordance with any of examples 1 to 8 can optionally comprise the fact that the first layer 102 and/or the second layer 106 comprise(s) or consist(s) of a semiconducting material, preferably silicon.

In example 10, the method in accordance with any of examples 1 to 9 can optionally comprise the fact that the cover layer 110 has a greater layer thickness than the liner layer 108.

In example 11, the method in accordance with any of examples 1 to 10 can optionally comprise the fact that the first layer 102 comprises or consists of monocrystalline silicon, and that the second layer 106 comprises or consists of polycrystalline silicon.

In example 12, the method in accordance with any of examples 1 to 11 can optionally comprise the fact that the second layer 106 comprises a first layer ply 306a and a second layer ply 306b arranged above the first layer ply 306a, wherein the first layer ply 306a comprises silicon nitride, and wherein the second layer ply 306b comprises a semiconducting material, preferably silicon or polysilicon.

Example 13 is a microelectromechanical component 400, comprising: a first layer 102 and a second layer 106 arranged above the first layer 102, wherein a cavity 104g is provided between the two layers 102, 106, and wherein the second layer 106 comprises a contacting region 100k, a liner layer 108, which is arranged in the contacting region 100k above the second layer 106, wherein the liner layer 108 comprises an undoped oxidic material and wherein the liner layer 108 has a layer thickness of less than 50 nm (e.g. less than 40 nm or less than 30 nm), a cover layer 110, which is arranged in the contacting region 100k above the liner layer 108, wherein the cover layer 110 comprises a doped oxidic material and wherein the cover layer 110 has a greater layer thickness than the liner layer 108, wherein a contact hole 424 extends through the liner layer 108 and the cover layer 110 as far as the second layer 106 for the purpose of contacting a surface section 406a of the second layer 106; an electrically conductive diffusion barrier layer 414, which covers the cover layer 110, a sidewall 110w, 108w of the contact hole 424 and the surface section 406a of the second layer 106; and a metal layer 416 arranged above the diffusion barrier layer 414 for contacting the second layer 106 in the contacting region 100k.

In example 14, the microelectromechanical component 400 in accordance with example 13 can optionally comprise the fact that the liner layer 108 comprises undoped silicon oxide, and that the cover layer 110 comprises doped silicon oxide.

In example 15, the microelectromechanical component 400 in accordance with example 13 or 14 can optionally comprise the fact that the cover layer 110 comprises silicon oxide which is doped with phosphorus or which is doped with boron and phosphorus.

In example 16, the microelectromechanical component 400 in accordance with any of examples 13 to 15 can optionally comprise the fact that the first layer 102 and/or the second layer 106 comprise(s) a semiconducting material, for example silicon.

In example 17, the microelectromechanical component 400 in accordance with any of examples 13 to 16 can optionally comprise the fact that the first layer 102 comprises monocrystalline silicon, and that the second layer 106 comprises polycrystalline silicon.

In example 18, the microelectromechanical component 400 in accordance with any of examples 13 to 17 can optionally comprise the fact that the second layer 106 comprises a first layer ply 306a and a second layer ply 306b arranged above the first layer ply 306a, wherein the first layer ply 306a comprises silicon nitride, and wherein the second layer ply 306b comprises a semiconducting material, preferably silicon.

In example 19, the microelectromechanical component 400 in accordance with any of examples 13 to 18 can optionally comprise the fact that a surface section of the first layer 102 and a surface section of the second layer 106 are exposed outside the contacting region 100k. Illustratively, the respective exposed surface sections are not covered by solid material.

In example 20, the microelectromechanical component 400 in accordance with any of examples 13 to 19 can optionally comprise the fact that the diffusion barrier layer 414 comprises titanium and/or platinum.

In example 21, the microelectromechanical component 400 in accordance with any of examples 13 to 20 can optionally comprise the fact that the metal layer 416 comprises gold.

In example 22, the microelectromechanical component 400 in accordance with any of examples 13 to 21 can optionally comprise the fact that the liner layer 108 has a layer thickness of more than 5 nm, e.g. more than 10 nm.

In example 23, the microelectromechanical component 400 in accordance with any of examples 13 to 22 can optionally comprise the fact that the cover layer 110 has a layer thickness in a range of 100 nm to 20 µm.

Example 24 is a method for processing a layer 106, the method comprising: forming at least one cutout 106h (e.g. a blind hole or a through hole) in the layer 106; covering an inner wall 106w of the at least one cutout 106h with a liner material; then filling a remaining region of the at least one cutout 106h with a further material; completely removing the liner material and the further material by means of wet-chemically etching the liner material using an etching solution, wherein the etching solution has a greater etching rate for the liner material than for the further material.

In example 25, the method in accordance with example 24 can optionally comprise the fact that the wet-chemically etching comprises completely removing the liner material from the at least one cutout 106h before the further material is completely removed from the at least one cutout 106h.

In example 26, the method in accordance with example 24 or 25 can optionally furthermore comprise the following: covering a region of the layer 106 outside the at least one cutout 106h at least in sections with the liner material, and covering the liner material in the region of the layer 106 outside the at least one cutout 106h with the further material.

In example 27, the method in accordance with any of examples 24 to 26 can optionally comprise the fact that the liner material comprises or is an undoped oxidic material, preferably undoped silicon oxide; and that the further material comprises or is a doped oxidic material, preferably doped silicon oxide.

In example 28, the method in accordance with any of examples 24 to 27 can optionally comprise the fact that the further material comprises or is phosphorus-doped oxidic material, preferably phosphorus-doped silicon oxide; or that the further material comprises or is oxidic material, preferably silicon oxide, which is doped with boron and phosphorus.

In example 29, the method in accordance with any of examples 24 to 28 can optionally comprise the fact that the etching solution is a hydrofluoric acid-based etching solution.

In example 30, the method in accordance with any of examples 24 to 29 can optionally comprise the fact that the layer 106 comprises or consists of a semiconducting material, preferably silicon or polysilicon.

In example 31, the method in accordance with any of examples 24 to 30 can optionally comprise the fact that the liner material is formed as a liner layer 108, and that the further material is formed as a cover layer 110, wherein the cover layer 110 has a greater layer thickness than the liner layer 108.

In example 32, the method in accordance with any of examples 24 to 31 can optionally comprise the fact that the layer 106 comprises a first layer ply 306a and a second layer ply 306b arranged above the first layer ply 306a, wherein the first layer ply 306a comprises silicon nitride, and wherein the second layer ply 306b comprises a semiconducting material, preferably silicon.

What is claimed is:

1. A microelectromechanical component, comprising:
    a first layer and a second layer arranged above the first layer, wherein a cavity is provided between the first layer and the second layer, and wherein the second layer comprises a contacting region;
    a liner layer arranged in the contacting region above the second layer, wherein the liner layer comprises an undoped oxidic material;
    a cover layer arranged in the contacting region above the liner layer, wherein the cover layer comprises a doped oxidic material and wherein the cover layer has a greater layer thickness than the liner layer;
    wherein a contact hole extends through the liner layer and the cover layer as far as the second layer to contact a surface section of the second layer;
    an electrically conductive diffusion barrier layer, which covers the cover layer, a sidewall of the contact hole and the surface section of the second layer; and
    a metal layer arranged above the diffusion barrier layer to contact the second layer in the contacting region.

2. The microelectromechanical component as claimed in claim 1, wherein the liner layer comprises undoped silicon oxide, and wherein the cover layer comprises doped silicon oxide.

3. The microelectromechanical component as claimed in claim 1, wherein the cover layer comprises silicon oxide which is doped with phosphorus or which is doped with boron and phosphorus.

4. The microelectromechanical component as claimed in claim 1, wherein the first layer comprises a semiconducting material, or wherein the second layer comprises the semiconducting material.

5. The microelectromechanical component as claimed in claim 1, wherein a surface section of the first layer and a surface section of the second layer are exposed outside the contacting region.

6. The microelectromechanical component as claimed in claim 1, wherein the liner layer has a layer thickness of more than 5 nm, and wherein the cover layer has a layer thickness in a range of 100 nm to 20 µm.

7. The microelectromechanical component as claimed in claim 1, wherein the liner layer has a first layer thickness, and wherein the cover layer has a second layer thickness greater than the first layer thickness.

8. The microelectromechanical component as claimed in claim 1, wherein the liner layer has a layer thickness of less than 50 nm.

9. The microelectromechanical component as claimed in claim 1, wherein the electrically conductive diffusion barrier layer comprises titanium and/or platinum.

10. The microelectromechanical component as claimed in claim 1, wherein the metal layer comprises gold or gold silicide.

11. A microelectromechanical component, comprising:
- a first layer and a second layer arranged above the first layer, wherein a cavity is provided between the first layer and the second layer, and wherein the second layer comprises a contacting region;
- a liner layer arranged in the contacting region above the second layer, wherein the liner layer comprises an undoped oxidic material;
- a beveled cover layer arranged in the contacting region above the liner layer, wherein the beveled cover layer comprises a doped oxidic material and wherein the beveled cover layer has a greater layer thickness than the liner layer;
- wherein a contact hole extends through the liner layer and the beveled cover layer as far as the second layer to contact a surface section of the second layer;
- an electrically conductive diffusion barrier layer, which covers the beveled cover layer, a sidewall of the contact hole and the surface section of the second layer; and
- a metal layer arranged above the diffusion barrier layer to contact the second layer in the contacting region.

12. The microelectromechanical component as claimed in claim 11, wherein the liner layer comprises undoped silicon oxide, and wherein the beveled cover layer comprises doped silicon oxide.

13. The microelectromechanical component as claimed in claim 11, wherein the beveled cover layer comprises silicon oxide which is doped with phosphorus or which is doped with boron and phosphorus.

14. The microelectromechanical component as claimed in claim 11, wherein the first layer comprises a semiconducting material, or wherein the second layer comprises the semiconducting material.

15. The microelectromechanical component as claimed in claim 11, wherein a surface section of the first layer and a surface section of the second layer are exposed outside the contacting region.

16. The microelectromechanical component as claimed in claim 11, wherein the liner layer has a layer thickness of more than 5 nm, and wherein the beveled cover layer has a layer thickness in a range of 100 nm to 20 µm.

17. The microelectromechanical component as claimed in claim 11, wherein the liner has a first layer thickness, and wherein the beveled cover layer has a second layer thickness greater than the first layer thickness.

18. The microelectromechanical component as claimed in claim 11, wherein the liner layer has a layer thickness of less than 50 nm.

19. The microelectromechanical component as claimed in claim 11, wherein the electrically conductive diffusion barrier layer comprises titanium and/or platinum.

20. The microelectromechanical component as claimed in claim 11, wherein the metal layer comprises gold or gold silicide.

* * * * *